US000001924H

United States Statutory Invention Registration [19]

[11] Reg. Number: H1,924

Zabinski et al. [45] Published: Dec. 5, 2000

[54] LOAD-ADAPTIVE NANOCRYSTALLINE CARBON/AMORPHOUS DIAMOND-LIKE CARBON COMPOSITE AND PREPARATION METHOD

[75] Inventors: Jeffrey S. Zabinski, Yellow Springs; Andrey A. Voevodin, Dayton; Somuri V. Prasad, Centerville, all of Ohio

[73] Assignee: The United States of America as represented by the Secretary of the Air Force, Washington, D.C.

[21] Appl. No.: 09/358,072

[22] Filed: Jul. 21, 1999

Related U.S. Application Data

[60] Provisional application No. 60/100,307, Sep. 15, 1998.

[51] Int. Cl.[7] ..... C23C 14/00

[52] U.S. Cl. ..... 204/192.16; 204/192.11; 204/192.15; 204/298.04; 204/298.12; 204/298.13; 204/298.16; 204/298.19; 204/298.2; 204/298.23; 204/298.26; 204/298.28

[58] Field of Search ..... 204/192.11, 192.15, 204/192.16, 298.04, 298.12, 298.13, 298.16, 298.19, 298.2, 298.23, 298.26, 298.28

[56] References Cited

U.S. PATENT DOCUMENTS

| | | | |
|---|---|---|---|
| 4,478,703 | 10/1984 | Edamura et al. | 204/298.28 |
| 5,423,970 | 6/1995 | Kugler | 204/298.28 |
| 5,525,199 | 6/1996 | Scobey | 204/298.28 |
| 5,989,397 | 11/1999 | Laube et al. | 204/298.03 |

OTHER PUBLICATIONS

Voevodin et al, "Combined magnetron sputtering and pulsed laser deposition of carbides and diamond–like carbon films," Appl. Phys. Lett., 69(2), pp. 188–190, Jul. 1996.

Voevodin et al, "Design of a Ti/TiC/DLC functionally gradient coating based on studies of structural transitions in Ti–C thin films," Thin Solid Films, 298(1,2), pp. 107–115, Apr. 1997.

Voevodin et al, "Nanocrystalline carbide/amorphous carbon composites," J. Appl. Phys., 82(2), pp. 855–858, Jul. 1997.

"Superhard Nanocrystalline $W_2W$/amorphous $Si_3N_4$ Composite Materials." S. Veprek et al, *J Vac Sci Tech* A 14(1):46–50 (Jan./Feb. 1966).

"A Concept for the Design of Novel Superhard Coatings," S. Veprek et al, *Thin Solid Films* 268:64–71 (1995)), (Month Unknown).

"Nanocrystalline Materials," H. Gleiter, in *Progress In Materials Science* 33:223–315 (1989), (month unknown).

"Ceramics Ductile at Low Temperatures," J. Karch et al., *Nature* 330:556 (Dec. 1987).

"Nanocrystalline WC and WC/a–C Composite Coatings Produced from Intersected Plasma Fluxes at Low Deposition Temperatures," A.A. Voevodin et al, submitted to *J Vac Sci Tech* (1998), (month unknown).

"Load–adaptive Crystalline–Amorphous Nanocomposites," A.A. Voevodin et al, *J Mat Sci* 33 (1998) 319–327, (Month Unknown).

"Nanocrystalline Carbide/Amorphous Carbon Composites," A.A. Voevodin et al, J Appl Phys 82(2) (Jul. 15, 1997) 855–8.

*Primary Examiner*—Charles T. Jordan
*Assistant Examiner*—Aileen J. Baker
*Attorney, Agent, or Firm*—Bobby D. Scearce; Thomas L. Kundert

[57] ABSTRACT

Nanocrystalline carbide/diamond-like carbon composite films and synthesis method near room temperature are described wherein combined magnetron sputtering and pulsed laser ablation produce plasma fluxes intersecting on a substrate surface to form metal carbide and diamond-like carbon composite films of about 10 to 50 nm carbide crystallites encapsulated in a $sp^3$ bonded amorphous diamond-like carbon matrix having a hardness of about 32 GPa and high plasticity, high toughness in contact loading and low friction coefficient.

16 Claims, 5 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

LOAD-ADAPTIVE NANOCRYSTALLINE CARBON/AMORPHOUS DIAMOND-LIKE CARBON COMPOSITE AND PREPARATION METHOD

CLAIM OF PRIORITY

This application claims priority of the filing date of Provisional application Ser. No. 60/100,307 filed Sep. 15, 1998.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to vapor deposited films, and more particularly to system and method for producing nanocrystalline carbide/diamond-like carbon composite films having particular application to wear and friction reducing coatings.

Nanocomposites with microstructures comprising nanocrystalline grains in an amorphous matrix can produce unique mechanical and tribological properties. For example, in super-hard (50–55 GPa) nanocomposites previously reported ("Superhard Nanocrystalline $W_2N$/amorphous $Si_3N_4$ Composite Materials," S. Veprek et al, *J Vac Sci Tech* A 14(1):46–50 (Jan./Feb. 1966); "A Concept for the Design of Novel Superhard Coatings," S. Veprek et al, *Thin Solid Films* 268:64–71 (1995)), plastic deformation was suppressed in order to maximize hardness, but the composites had characteristic brittleness undesirable for tribological applications where toughness and low friction coefficient are desired. Room temperature ductility in brittle ceramics was achieved by reducing grain size to nanometer levels ("Nanocrystalline Materials," H. Gleiter, in *Progress In Materials Science* 33:223–315 (1989); "Ceramics Ductile at Low Temperatures," J. Karch et al, *Nature* 330:556 (Dec. 1987)).

The invention solves or substantially reduces in critical importance problems with prior art composites and deposition methods by providing nanocrystalline carbide/diamond-like carbon (DLC) composite films and preparation method near room temperature. The composites are produced using a deposition technique that combines magnetron sputtering and pulsed laser ablation to produce plasma fluxes intersecting on a substrate surface to form metal, carbide and diamond-like materials. Composites produced according to the invention comprise 10 nm carbide crystallites encapsulated in a $sp^3$ bonded amorphous DLC matrix having hardness of about 32 GPa and high plasticity at loads exceeding the elastic limit.

The invention has substantial application to production of wear and friction reducing composite films applied as coatings for protection against high contact loading in sliding and rolling. Composite films according to the invention exhibit high hardness and contact toughness, low (about 0.2) friction coefficient and low wear rates, and may adapt in use from hard to plastic depending on operating conditions, which substantially increase the wear life of bearings, shafts and other machine parts to which the films are applied as coatings.

It is therefore a principal object of the invention to provide improved nanocrystalline carbide/diamond-like carbon composites and method for producing the composites.

It is a further object of the invention to provide nanocrystalline carbide/diamond-like composite coatings for tribological applications.

It is a further object of the invention to provide low friction coatings having high contact toughness and low wear rates for systems operating under high contact stress such as in bearings, shafts and other precision turbine engine parts.

These and other objects of the invention will become apparent as a detailed description of representative embodiments proceeds.

SUMMARY OF THE INVENTION

In accordance with the foregoing principles and objects of the invention, nanocrystalline carbide/diamond-like carbon composite films and synthesis method near room temperature are described wherein combined magnetron sputtering and pulsed laser ablation produce plasma fluxes intersecting on a substrate surface to form metal carbide and diamond-like carbon composite films of about 10 to 50 nm carbide crystallites encapsulated in a $sp^3$ bonded amorphous diamond-like carbon matrix having a hardness of about 32 GPa and high plasticity, high toughness in contact loading and low friction coefficient.

DESCRIPTION OF THE DRAWINGS

The invention will be more clearly understood from the following detailed description of representative embodiments thereof read in conjunction with the accompanying drawings wherein.

FIG. **6*a* shows the plasticity of hard TiC/a-C composite films according to the invention observed in nanoindentation with 1 mN load applied to a Berkovich pyramid.

DETAILED DESCRIPTION

Background information and discussions of the underlying principles of the invention and experimental work related to the invention may be found by reference to the papers "Nanocrystalline WC and WC/a-C Composite Coatings Produced from Intersected Plasma Fluxes at Low Deposition Temperatures," A. A. Voevodin et al, submitted to *J Vac Sci Tech* (1998); "Load-adaptive Crystalline-Amorphous Nanocomposites," A. A. Voevodin et al, *J Mat*

*Sci* 33 (1998) 319–327; and "Nanocrystalline Carbide/Amorphous Carbon Composites," A. A. Voevodin et al, J Appl Phys 82(2) (Jul. 15, 1997) 855-8, copies of which are attached hereto as Appendices A through C, the entire teachings of which are incorporated by reference herein.

Figure 1:
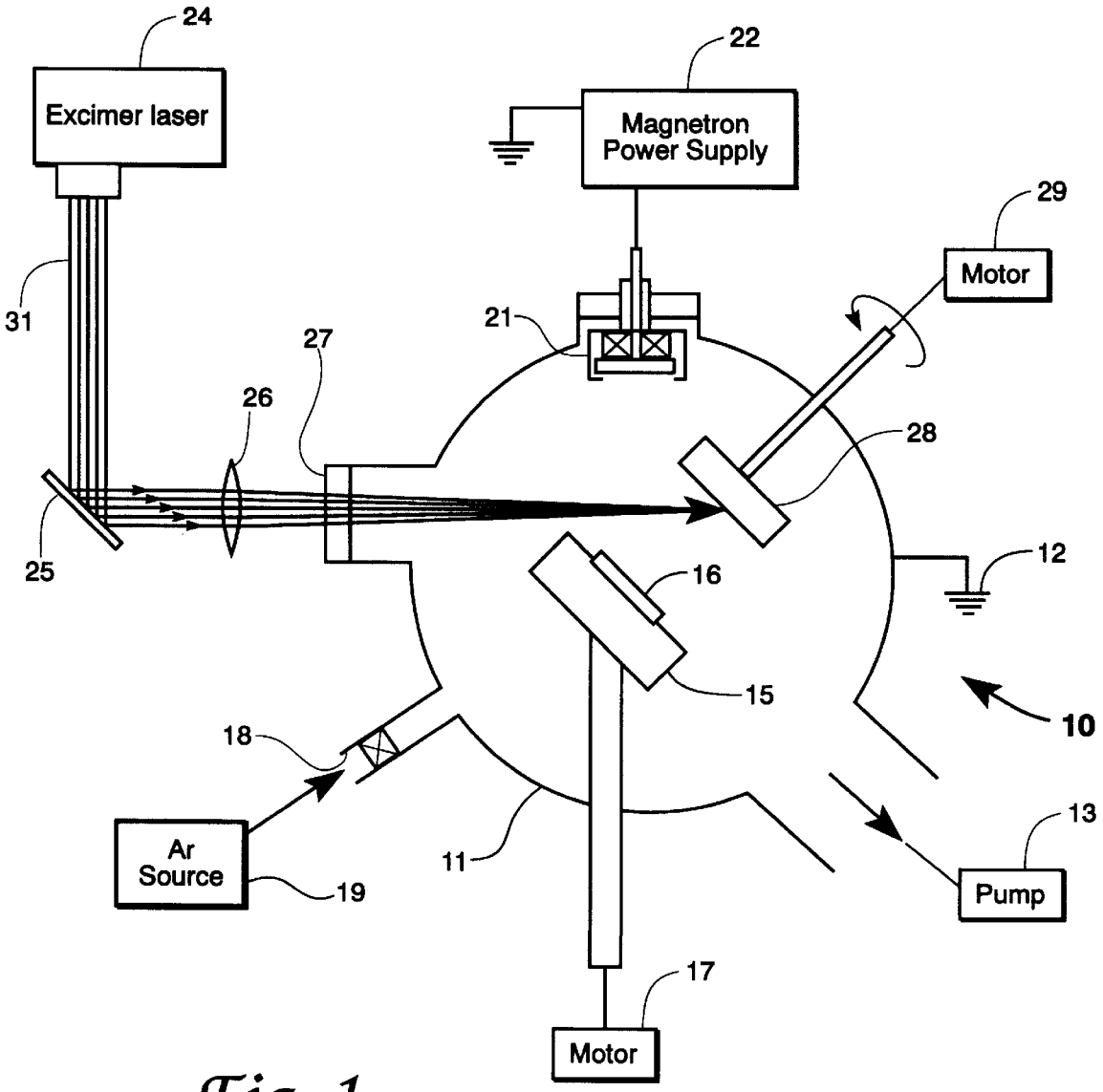
Fig. 1 PRIOR ART
FIG. 1 shows schematically the magnetron assisted pulsed laser deposition (PLD) system used in demonstration of the method of the invention.

Referring now to the accompanying drawings, FIG. 1 shows schematically a diagram of the essential components of magnetron assisted pulsed laser deposition (PLD) system 10 representative of the invention and useful in the practice of the method thereof. An ultra-high vacuum chamber 11, grounded at 12, is operatively connected to turbomolecular vacuum pump unit 13 capable of evacuating chamber 11 to about $10^{-9}$ to $10^{-10}$ torr. Rotatable substrate table 15 supporting substrate 16 is disposed within chamber 11 and driven by suitable external motor means 17. Gas inlet 18 defined in a wall of chamber 11 and communicating with source 19 of inert gas provide means for controlled insertion of an inert gas (preferably argon) atmosphere in the operation of system 10 as described below. Magnetron sputtering source 21 is disposed in a wall of chamber 11 in suitable position for sputtering a selected metal onto substrate 16. In a unit built and operated in demonstration of the invention, source 21 was a Mini-Mac manufactured by US, Inc., powered by magnetron power supply 22 (model MDX-1, Advanced Energy). The invention was demonstrated by production of nanocrystalline TiC carbides in an amorphous diamond-like carbon (a-DLC) matrix, but is also applicable to other carbides in an a-DLC matrix, including carbides of tungsten, silicon, vanadium, tantalum, zirconium, hafnium, chromium, molybdenum, niobium, copper, aluminum and others as would occur to the skilled artisan practicing the invention. Pulsed laser generator 24 (model 110i, Lambda Physik) is disposed externally of chamber 11, and programmable mirror 25, focusing lens 26 and an entrance window 27 in a wall of chamber 11 provide optical means for directing a pulsed laser beam onto rotatable target 28 disposed within chamber 11. Externally disposed motor 29 is operatively connected to and selectively rotates target 28.

In the operation of system 10 for producing composites in demonstration of the invention, pulsed laser beam 31 was focused onto graphite target 28 in order to generate a carbon flux, while magnetron 21 generated a flux of Ti atoms. Target orientations defined a point of intersection of the C and Ti fluxes at the surface of substrate 16. Substrate 16 comprised a disk of metallographically polished 440C steel. Prior to deposition, the substrates were cleaned in a 1 keV Ar discharge for 15 minutes, which raised their temperature to about 50–80° C. No additional substrate heating or biasing was used during deposition. The magnetron target-substrate distance was set at 15 cm, and the PLD target-substrate distance was set at 6 cm. Chamber 11 was initially evacuated to a base pressure of $10^{-7}$ torr, and substrate 16 temperature was held constant at 100° C. Pulses of 248 nm wavelength UV radiation, 17 ns duration and 200 mJ energy from laser generator 24 were focused onto target 28 at about 3–7 Hz to attain about $10^9$ W/cm$^2$ power density. Carbon plumes formed thereby expanded in a direction normal to target 28 toward substrate 16 with kinetic energies of 1.5 keV in the leading edge. A Ti plasma flux directed toward substrate 16 with energy of several electron volts was produced with an unbalanced magnetron 21 operating at 12 W/cm$^2$ power density in $2\times10^{-3}$ torr Ar within chamber 11. Films 0.5 $\mu$m thick were grown at a deposition rate of 10 nm/min. Nanocrystalline TiC/a-C composite films on substrate 16 produced under the foregoing conditions had 10–50 nm sized TiC crystallites encapsulated into an a-DLC matrix of about 30 vol % fraction, and had a friction coefficient of about 0.15 and a contact toughness several times the toughness of amorphous carbon and/or nanocrystalline TiC.

In accordance with a principal feature of the invention, independent operation of the Ti and C sources permitted composition control in the composite films, based on the relationship between film stoichiometry and deposition rates of Ti and C. For dense films, the number of Ti atoms $Q_{Ti}$ and the number of C atoms $Q_C$ arriving per unit area of substrate in unit time are related to the respective Ti and C deposition rates $D_{Ti}$ and $D_C$ by, $$D_{Ti}=M_{Ti}\rho_{Ti}^{-1}N_a^{-1}S_{Ti}\,Q_{Ti} \tag{1a}$$

$$D_c=M_C\rho_C^{-1}N_a^{-1}S_CQ_C \tag{1b}$$

where $\rho_{Ti}$ and $\rho_C$ are the densities and $M_{Ti}$ and $M_C$ are the atomic weights of Ti and C, $N_a$ is the Avogadro number, and $S_{Ti}$ is the sticking coefficient for Ti atoms deposited by magnetron sputtering and $S_C$ is the sticking coefficient for C atoms deposited by PLD. Eqs (1a) and (1b) can be used to predict $Ti_xC_y$ film stoichiometric coefficients using, $$x/y=(Q_{Ti}S_{Ti}^*)/(Q_CS_C^{c*}) \tag{2}$$

where $S_{Ti}^*$ and $S_C^*$ are sticking coefficients of Ti and C atoms at simultaneous deposition, assuming that (1) the number of C atoms arriving at substrate 16 in $2\times10^{-3}$ torr of Ar is the same as the number arriving in $10^{-7}$ torr, (2) no interaction occurs between C and Ti sources during simultaneous deposition, and (3) sticking coefficients $S_{Ti}^*$ and $S_C^*$ are approximately equal to $S_{Ti}$ and $S_C$, respectively. The first two assumptions are met by suitable target 28 orientation (FIG. 1), and by the highly directed fluxes of atomic and molecular species with kinetic energies exceeding the thermal energies of the sputter gas molecules by a factor of ten or more. The mean free paths for energetic C and Ti atoms at $2\times10^{-3}$ torr are 6 cm and 5 cm, respectively, based on thermalized distance calculations (W. D. Westwood, J Vac Sci Tech 15, 1 (1978)); the distance required to thermalize an atom with initial energy of 5 eV is 10 cm for C and 20 cm for Ti. Comparing these values with the substrate-target distances, the directional character of both fluxes is preserved, and the average atom will undergo one or two collisions with Ar atoms before reaching substrate 16. The third assumption was verified experimentally in demonstration depositions.

Stoichiometric coefficients of $Ti_xC_y$ films can be found from Eqs (1a), (1b) and (2)

$$x=[1+\alpha(D_C/D_{Ti})]^{-1} \tag{3a}$$

$$y=[1+\alpha^{-1}(D_{Ti}/D_C)]^{-1} \tag{3b}$$

where $\alpha=(M_{Ti}\rho_C)/(M_C\rho_{Ti})$ and equals 2.66 if the titanium film density is 4.5 g/cm$^3$ and the DLC film density is 3.0 g/cm$^3$.

Figure 2:
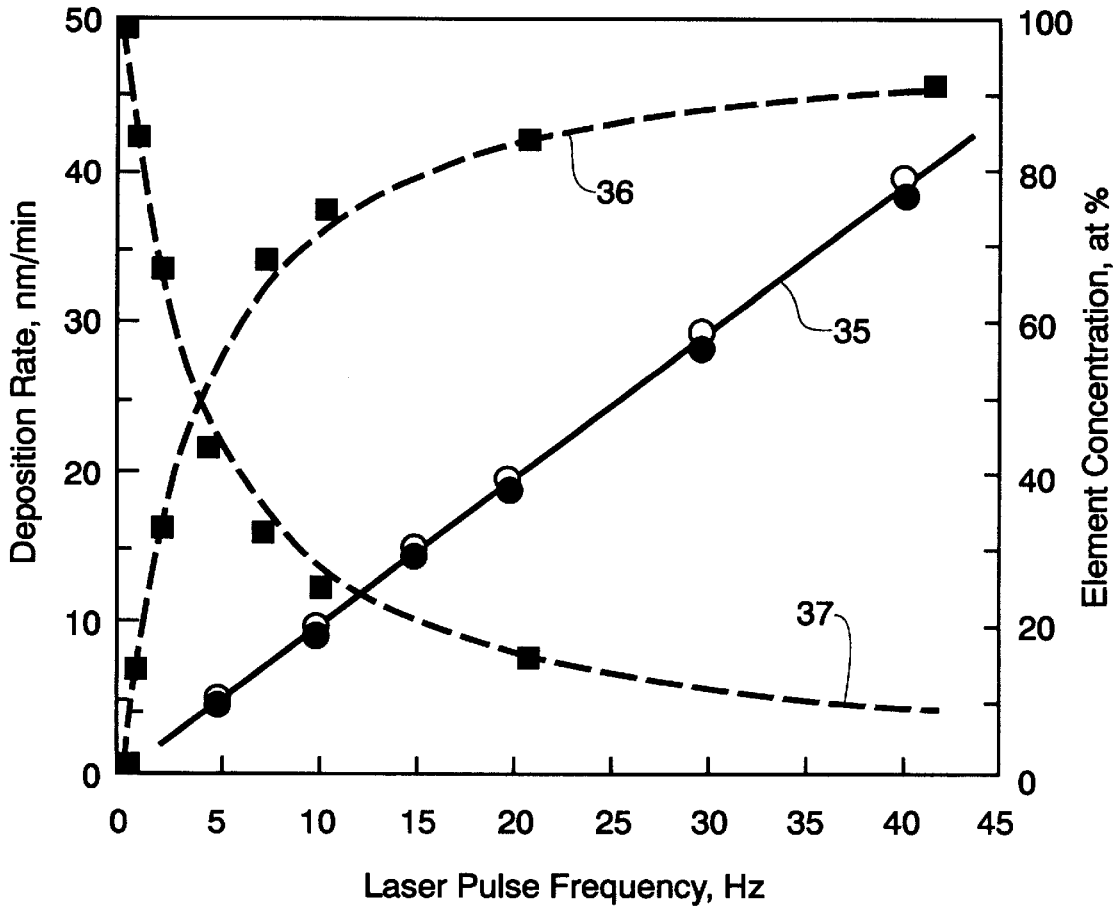
Fig. 2 PRIOR ART
FIG. 2 shows deposition rate of carbon films plotted as a function of laser pulse frequency in $10^{-7}$ torr vacuum and in Ar at $2\times10^{-3}$ torr, and the variation of $Ti_xC_y$ composition as a function of laser pulse frequency with the magnetron running at constant power.

According to Eqs (3a) and (3b), either $D_{Ti}$ or $D_C$ can be varied to affect $Ti_xC_y$ film composition. In the demonstration films, composition was controlled by varying $D_c$ with $D_{Ti}$ held constant at 10 nm/min using constant power to magnetron 21. For films without Ti, magnetron 21 was turned off but Ar pressure was kept constant. Deposition rate of C was varied by changing the frequency of laser pulses. Referring now to FIG. 2, plot 35 shows the linear dependence of $D_C$ on laser pulse frequency at $10^{-7}$ torr pressure (open circles) and in Ar at $2\times10^{-3}$ torr (solid circles), and shows the negligible difference in deposition rates in vacuum and $2\times10^{-3}$ torr Ar. Plots 36 (for carbon) and 37 (for titanium) show $Ti_xC_y$ composition as a function of laser pulse frequency with magnetron 21 at constant power. Solid squares are experimental x-ray photoelectron spectroscopy (XPS) measured elemental concentrations in demonstration depositions and dashed lines are calculated values. The slope of plot 35 in FIG. 2 gives the deposition rate of carbon as 0.016 nm/pulse, thereby allowing $Ti_xC_y$ composition to be predicted from Eqs (3a) and (3b) as a function of pulse frequency.

It is important that energies of deposited Ti and C atoms stay constant in the range of $Ti_xC_y$ compositions because magnetron power, laser pulse energy and pressure remain the same. TABLE 1 shows correlations of laser pulse frequency, TiC stoichiometry, chemical composition and volume percent carbon bonded in a-DLC and nanocrystalline TiC phases in demonstration depositions.

Figure 3:
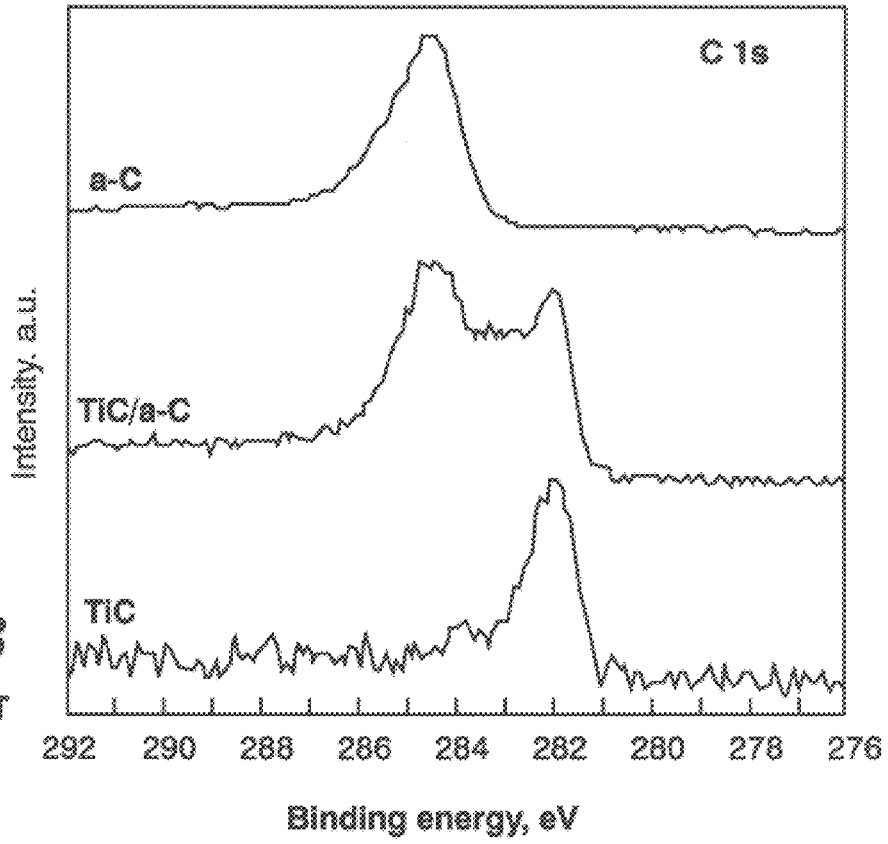
Fig. 3 PRIOR ART
FIG. 3 shows a comparison of carbon 1s binding energy spectra for nanocrystalline TiC, amorphous carbon (a-C) and composite TiC/a-C films from x-ray photoelectron spectroscopy.

TABLE I shows the laser pulse frequency of about 7 Hz provided nanocrystalline TiC/a-DLC composites with the volume fraction of TiC and a-DLC phases corresponding to the design of load adaptive composites. The films were shown by XPS to contain about 61 at% C, 30 at% Ti and 9 at% O. Oxygen contamination resulted from high Ti reactivity to residual water in chamber 11 during deposition and to laboratory air after deposition. From Ti/C composition ratio, $Ti_{0.3}C_{0.7}$ stoichiometry of the films was determined. In the over stoichiometric films, carbon was found to be in both Ti-C and C-C bonded forms. FIG. 3 shows a comparison of C 1s binding energy spectra for nanocrystalline TiC, a-C and composite TiC/a-C films from XPS studies. Two peaks corresponding to TiC and a-DLC phases indicated a two-phase composition of the deposited films.

TABLE 1

| Laser Pulse | Ti—C | Composition (at %) | | | Percent C Bonded | |
|---|---|---|---|---|---|---|
| Freq (Hz) | Stoichiometry | Ti | C | O | a-DLC | TiC |
| 4 | $Ti_{.45}C_{.55}$ | 41 | 50 | 9 | 15 | 85 |
| 5 | $Ti_{.41}C_{.59}$ | 37 | 54 | 9 | 22 | 78 |
| 6 | $Ti_{.37}C_{.63}$ | 34 | 58 | 8 | 29 | 71 |
| 7 | $Ti_{.32}C_{.68}$ | 29 | 62 | 9 | 50 | 50 |
| 9 | $Ti_{.28}C_{.72}$ | 26 | 67 | 7 | 67 | 33 |
| 11 | $Ti_{.25}C_{.75}$ | 23 | 69 | 8 | 73 | 27 |
| 17 | $Ti_{.18}C_{.82}$ | 17 | 78 | 5 | 90 | 10 |
| 40 | $Ti_{.09}C_{.91}$ | 9 | 88 | 3 | 99 | 1 |

Figure 4:
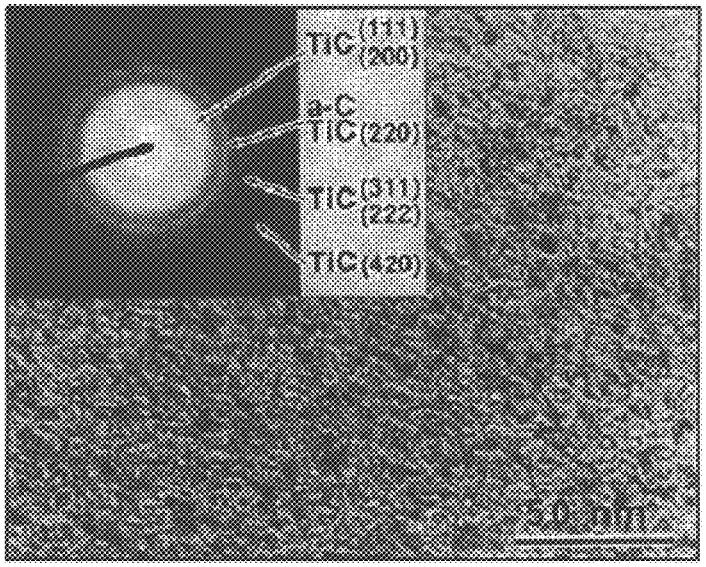
Fig. 4 PRIOR ART
FIG. 4 shows a bright field transmission electron microscopy (TEM) image of 50 nm thick TiC/a-C film and its SAD pattern.

Formation of both nanocrystalline TiC and a-DLC phases was confirmed in TEM of similar films deposited on a copper grid to about 50 nm thickness to allow TEM investigations (FIG. 4). An insert in FIG. 4 shows selected area diffraction (SAD) rings originating from polycrystalline TiC and a diffused ring from an a-DLC phase. Diffraction from (111) and (200) TiC planes were close to each other, producing an inside broad ring in the SAD insert in FIG. 4. A second in brightness ring was in a position for diffraction from the (220) TiC plane with 0.15 nm d-spacing. Also, a-DLC carbon produced a diffusive halo at the same position due to an averaged 0.15 nm interatomic distance in a hydrogen-free $sp^3$ bonded amorphous DLC. Based on a high intensity and broadness of this ring, it was assigned primarily to the a-DLC phase. Outside diffraction rings in FIG. 4 were from (311), (222) and (420) TiC crystal planes.

Figure 5:
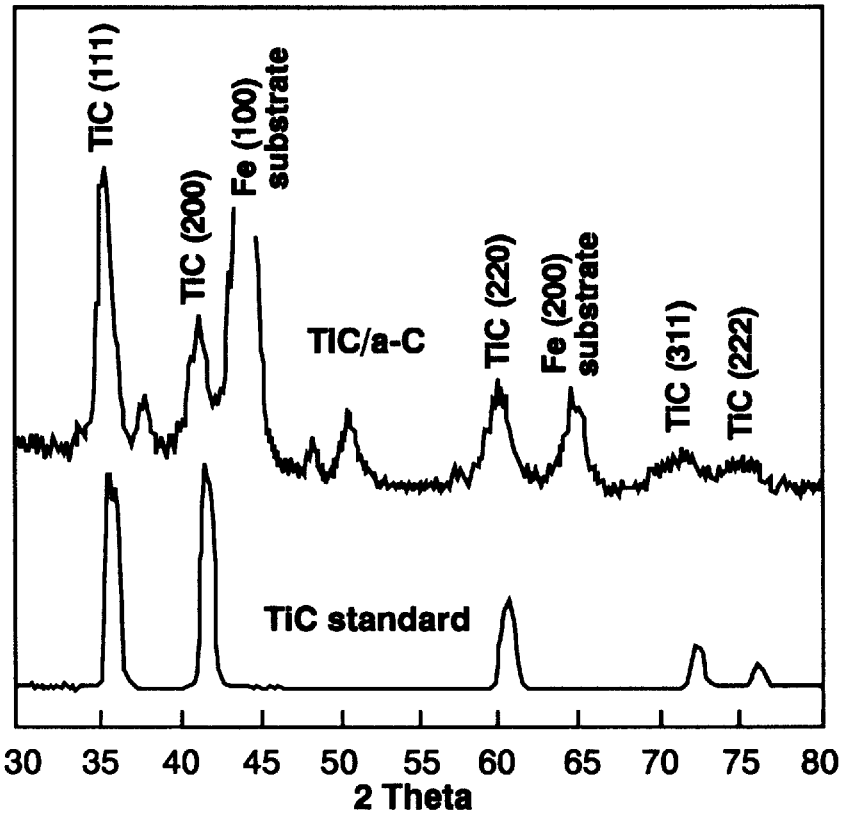
Fig. 5 PRIOR ART
FIG. 5 shows the grazing angle x-ray diffraction (XRD) spectrum.a for nanocrystalline TiC/a-C composite film and a similar spectrum for macrocrystalline TiC.

A crystalline character of the TiC phase was additionally proved in 5° incident angle XRD of 0.5 $\mu$m films deposited on steel substrates. Diffraction peaks for (111), (200), (220), (311) and (222) planes had a considerable broadening indicating nanocrystallinity. FIG. 5 shows the grazing angle XRD spectrum for nanocrystalline TiC/a-C composite film and a similar spectrum for macrocrystalline TiC. The size of TiC crystallites was about 10 nm from XRD and TEM, with uniform distribution and a complete encapsulation of TiC nanocrystals in the a-C matrix.

Figure 6A:
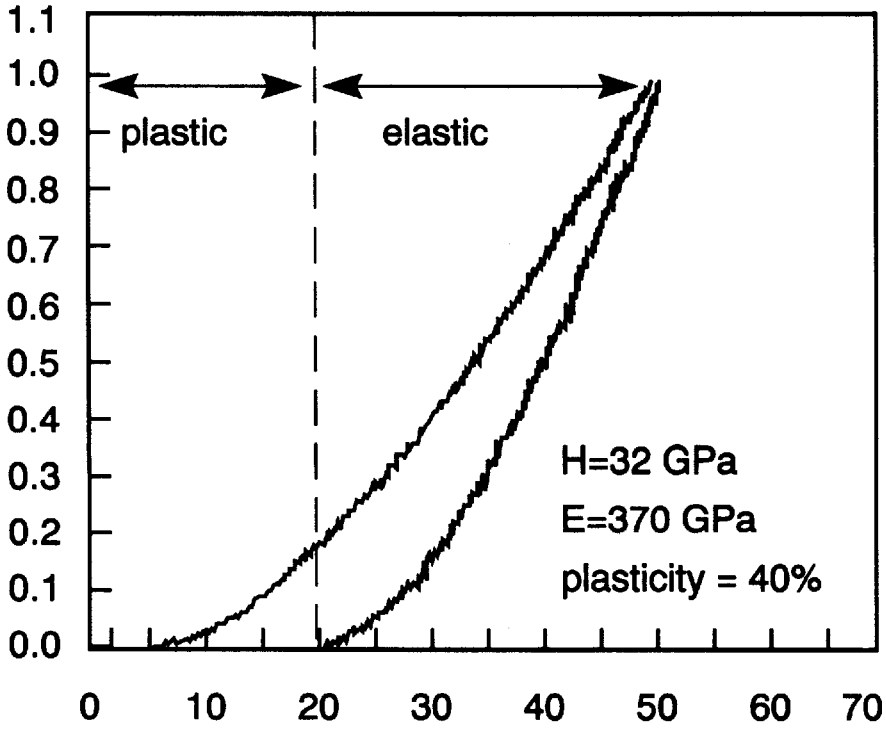
Fig. 6a PRIOR ART
FIG. 6*b*** shows the plasticity of hard TiC/a-C composite films of the invention observed in scratch tests with 50 N load applied to a 0.2 mm radius diamond tip.
Figure 6B:
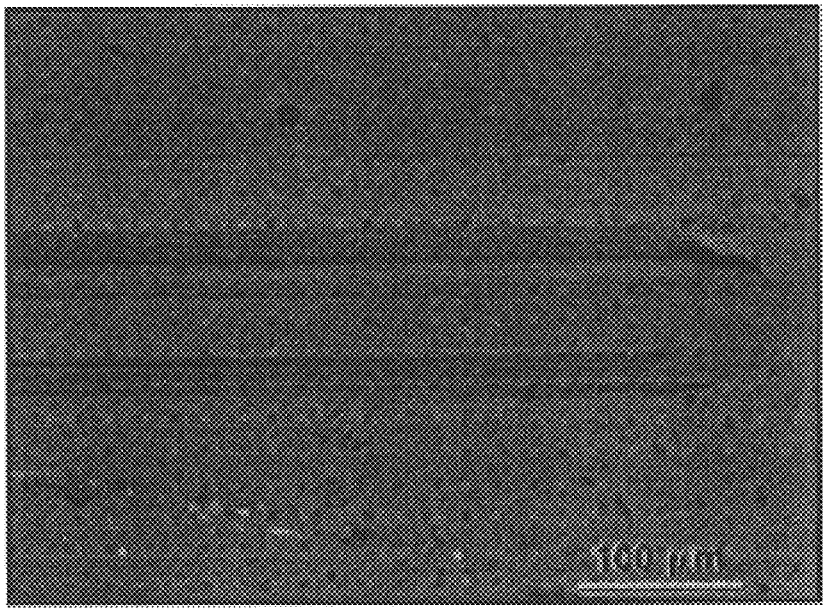
Fig. 6b PRIOR ART

FIG. 6*a* shows the plasticity of hard TiC/a-C composite films observed in nanoindentation with 1 mN load applied to a Berkovich pyramid. FIG. 6*b* shows the plasticity of hard TiC/a-C composite films observed in scratch tests (in the direction of the arrow) with 50 N load applied to a 0.2 mm radius diamond tip. Hardness of the TiC/a-DLC composite was 32 GPa, determined in nanoindentation tests with a Verkovich indenter under a 1 mN load. This was higher than 27 GPa hardness of nanocrystalline stoichiometric TiC, but not as high as 60 GPa hardness of a-DLC. However, TiC/a-C composite showed 40% plasticity in the indentation deformation (FIG. 6*a*), which was four times more than that observed for the super-hard but brittle a-DLC.

Extremely high toughness was observed in the scratch tests of TiC/a-DLC composites. Tests were performed with a 0.2 mm radius diamond tip loaded from 0 to 100 N and dragged on the film surface with a constant speed of 10 mm/min. Composite TiC/a-C films (0.5 $\mu$m thick) withstood 70 N load without brittle failure. The high toughness of the composites was associated with plastic behavior at a high local load as demonstrated in FIG. 6*b*. A 10 GPa contact stress was estimated to be induced in this test, using an applied load and the scratch geometry. Under this stress, a hard TiC/a-C film exhibited a remarkable plasticity without signs of brittle fracturing. This change in TiC/a-C behavior from hard to plastic at deformations above elastic limit reduced acting peak stresses and prevented failure of the composite integrity.

Ball-on-disk friction tests of TiC/a-C composites shown friction coefficient of about 0.15 in unlubricated sliding against a steel ball at 0.8 GPa initial contact pressure in air with 50% relative humidity. This was considerably lower than the friction coefficients of TiN, CrN (0.5–0.6) and TiC (0.3–0.4) coatings in similar sliding conditions.

The entire teachings of all references cited herein are incorporated herein by reference.

The invention therefore provides a method for producing nanocrystalline carbide/a-DLC composite films having high hardness, low friction coefficient and high toughness. It is understood that modifications to the invention may be made as might occur to one with skill in the field of the invention within the scope of the appended claims. All embodiments contemplated hereunder which achieve the objects of the invention have therefore not been shown in complete detail. Other embodiments may be developed without departing from the spirit of the invention or from the scope of the appended claims.

We claim:

1. A magnetron assisted laser deposition system for producing metal carbide and diamond-like carbon composite films, comprising:

(a) a vacuum chamber and vacuum pump operatively connected to said vacuum chamber for selectively evacuating said vacuum chamber;

(b) a substrate disposed within said vacuum chamber;

(c) a gas inlet defined in a wall of said vacuum chamber and a source of inert gas operatively connected to said gas inlet for selectively inserting said inert gas into said vacuum chamber;

(d) a magnetron sputtering source for generating within said vacuum chamber a flux of metal atoms directed toward said substrate;

(e) a carbon graphite target disposed within said vacuum chamber;

(f) a laser generator and optical means for directing a laser beam onto said carbon graphite target for generating a flux of carbon atoms directed toward said substrate;

(g) wherein said flux of metal atoms intersects said flux of carbon atoms near the surface of said substrate to form on said substrate a composite film of metal carbide in a diamond-like carbon matrix.

2. The system of claim 1 wherein said metal is selected from the group consisting of titanium, tungsten, silicon, vanadium, tantalum, zirconium, hafnium, chromium, molybdenum, niobium, copper and aluminum.

3. The system of claim 1 wherein said source of inert gas comprises argon.

4. The system of claim 1 wherein said substrate comprises a stainless steel.

5. The system of claim 1 further comprising means for rotating said substrate and means for rotating said carbon graphite target.

6. The system of claim 1 wherein said laser source is an excimer pulsed laser generator.

7. A method for producing a metal carbide and diamond-like carbon composite film, comprising the steps of:

(a) providing a vacuum chamber and vacuum pump operatively connected to said vacuum chamber for selectively evacuating said vacuum chamber, said vacuum chamber having a gas inlet defined in a wall of said vacuum chamber and a source of inert gas operatively connected to said gas inlet for selectively inserting said inert gas into said vacuum chamber;

(b) disposing within said vacuum chamber a substrate and a carbon graphite target;

(c) providing a means for generating a flux of metal atoms within said vacuum chamber and generating a flux of metal atoms directed toward said substrate;

(d) directing a laser beam onto said carbon graphite target to generate a flux of carbon atoms directed toward said substrate;

(e) wherein said flux of metal atoms intersects said flux of carbon atoms near the surface of said substrate to form on said substrate a composite film of metal carbide in a diamond-like carbon matrix.

8. The method of claim 7 wherein said metal is selected from the group consisting of titanium, tungsten, silicon, vanadium, tantalum, zirconium, hafnium, chromium, molybdenum, niobium, copper and aluminum.

9. The method of claim 7 wherein said source of inert gas comprises argon.

10. The method of claim 7 wherein said substrate comprises a stainless steel.

11. The method of claim 7 further comprising the steps of rotating said substrate and rotating said carbon graphite target.

12. The method of claim 7 wherein said composite film is formed on said substrate at about room temperature.

13. The method of claim 7 wherein said step of generating a flux of metal atoms is performed utilizing a magnetron sputtering source.

14. The method of claim 7 wherein said step of generating a flux of carbon atoms is performed utilizing an excimer pulsed laser generator.

15. A nanocrystalline metal carbide and diamond-like carbon composite film containing about 10 to 50 nm metal carbide crystallites encapsulated in an amorphous diamond-like carbon matrix of about 30 volume percent fraction and fabricated according to the method of claim 7.

16. The composite film of claim 15 wherein said metal is selected from the group consisting of titanium, tungsten, silicon, vanadium, tantalum, zirconium, hafnium, chromium, molybdenum, niobium, copper and aluminum.

* * * * *